United States Patent [19]

Iida et al.

[11] Patent Number: 4,510,195

[45] Date of Patent: Apr. 9, 1985

[54] FLEXIBLE INSULATIVE SUBSTRATES HAVING TWO GLASS LAYERS AT LEAST ONE SIDE THEREOF AND A METHOD FOR MAKING SUCH SUBSTRATES

[75] Inventors: Hideyo Iida; Koumei Kato; Toshio Mishuku; Yukiko Fujimaki, all of Tokyo, Japan

[73] Assignee: Taiyo Yuden Kabushiki Kaisha, Taito, Japan

[21] Appl. No.: 632,559

[22] Filed: Jul. 19, 1984

[30] Foreign Application Priority Data

Mar. 7, 1984 [JP] Japan .................... 59-44554

[51] Int. Cl.³ .................. B32B 3/26; B32B 15/04; B32B 17/06
[52] U.S. Cl. .................. 428/215; 427/376.4; 427/419.4; 428/312.6; 428/312.8; 428/433
[58] Field of Search .......... 428/215, 216, 312.2, 428/312.6, 312.8, 314.4, 314.8, 318.6, 319.1, 433; 427/373, 376.4, 419.3, 419.4

[56] References Cited

U.S. PATENT DOCUMENTS

| 3,184,371 | 5/1965 | Seidl .................. | 428/312.6 |
| 3,300,289 | 1/1967 | Long .................. | 428/312.6 |
| 3,330,627 | 7/1967 | McCormick et al. .... | 428/312.6 |
| 3,523,817 | 8/1970 | Reiss .................. | 427/376.4 |
| 3,627,560 | 12/1971 | Morgan ............... | 427/376.4 |
| 4,024,309 | 5/1977 | Pender ............... | 428/312.6 |

Primary Examiner—William J. Van Balen
Attorney, Agent, or Firm—Flynn, Thiel, Boutell & Tanis

[57] ABSTRACT

A flexible, glass-covered substrate useful for use in fabrication of electronic elements or solar cells. The substrate comprises a thin metal plate, a first glass layer formed on at least one side of the metal plate and having a multitude of pores therein, and a second glass layer formed on the first glass layer is described. The method for making such substrates is also described.

10 Claims, 2 Drawing Figures

FLEXIBLE INSULATIVE SUBSTRATES HAVING TWO GLASS LAYERS AT LEAST ONE SIDE THEREOF AND A METHOD FOR MAKING SUCH SUBSTRATES

BACKGROUND OF THE INVENTION

1. Field of the Invention

This invention relates to flexible insulative substrates used to form elements such as amorphous silicon solar cells, thick and thin film circuits, and the like. It also relates to a method for making such substrates.

2. Description of the Prior Art

Known flexible insulative substrates used to form elements such as amorphous silicon solar cells include (1) substrates obtained by forming a thin film of silicon oxide or silicon nitride on a thin stainless steel plate, (2) substrates obtained by forming a layer of a resin such as polyimide on a thin stainless steel plate and subsequently a layer of titanium oxide, silicon oxide or silicon nitride on the resin layer by vacuum evaporation, and (3) thin flexible glass plate substrates.

However, the known substrates have the respective disadvantages. For instance, with the substrates (1) and (2), the stainless steel plate has to be finished to have a surface roughness below 0.1 $\mu$m for the former substrate and a surface roughness below 0.5 $\mu$m for the latter substrate. Otherwise, when the insulating covering layer is formed, a satisfactory insulative property cannot be assured. The substrates (2) may cause insulative failure because the resin layer is so low in hardness that it is apt to suffer defects thereon. Upon fabrication of an element on the substrate, the resin layer frequently generates a gas from the inside thereof though small in amounts with pinholes being left in the layer, causing an insulation failure. Although the substrate (3) has not such drawbacks as described above, it is so fragile that close attention must be paid to handling of the glass substrate. Otherwise, it would be broken.

SUMMARY OF THE INVENTION

It is accordingly an object of the present invention to provide flexible glass-covered substrates which overcome the drawbacks of the prior art substrates.

It is another object of the invention to provide flexible glass-covered substrates which exhibit good insulating property even when a metal plate of a relatively high surface roughness is used.

It is a further object of the invention to provide flexible glass-covered substrates which have a less tendency toward deterioration of insulating property and breakage even when external force is applied thereto.

Other objects and further features and advantages of the invention will be apparent from the following detailed description taken in conjunction with the accompanying drawing.

DETAILED DESCRIPTION AND PREFERRED EMBODIMENTS OF THE INVENTION

Figure 1:
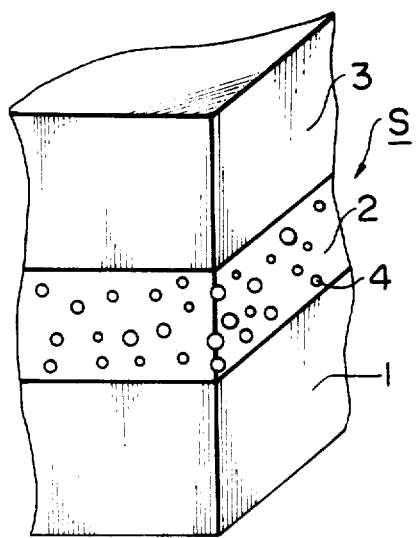
FIG. 1 is a schematic enlarged view of a substrate according to one embodiment of the invention.

Reference is now made to FIG. 1, in which there is shown a substrate S. The substrate useful for forming thereon solar cells, thin or thick film circuits and the like comprises a thin metal plate 1 such as titanium, stainless steel or the like. The metal plate 1 is formed on at least one side thereof with a first insulative porous glass layer 2 and a second insulative dense glass layer 3. Pores 4 in the first glass layer may be separate from each other, i.e. so-called closed cells, or may be open cells.

The metal plate 1 usually has a thickness of from 10 to 300 $\mu$m and is preferred to have a surface roughness below 5 $\mu$m. The first insulative porous glass layer 2 is formed in a thickness of from 5 to 50 $\mu$m and is preferred to have a porosity of from 100 to 1000 ppm by volume. The second insulative glass layer 3 has generally a thickness of from 5 to 50 $\mu$m. As will be apparent from the above, the substrate S comprising the metal plate 1 having the first and second layers 2, 3 is so thin that flexibility is ensured. Glass compositions for the first and second glass layers 2, 3 will be described with regard to the method for making the substrate S.

Figure 2:
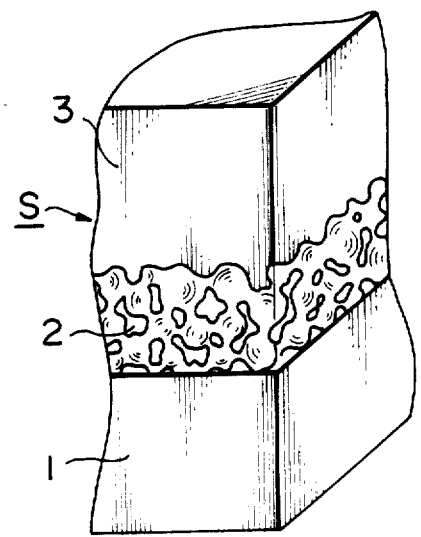
FIG. 2 is similar to FIG. 1 and shows another embodiment of the invention.

The method for making the substrate according to the invention is described. The method comprises providing a thin metal plate, applying a glass paste comprising a glass component in the form of powder and a resin binder on at least one side of the metal plate, heating the applied plate at temperatures sufficient to fuse the glass powder, and cooling the plate and hardening the fused glass to form a first insulative glass layer. Subsequently, a glass paste comprising a glass component whose softening point is lower than the softening point of the glass component for the first layer is applied onto the first layer, heated to temperatures sufficient to fuse the glass component, and cooled and hardened to form a second insulative glass layer of a predetermined thickness. As a result, the first glass layer formed has a multitude of pores therein. The state of pores in the first layer is particularly shown in FIGS. 1 and 2 and varies largely depending on the operation conditions. If high fusing temperatures are used, a continuous cell as shown in FIG. 2 tends to be formed in the first glass layer. On the other hand, if fusing temperatures are low, say, 500° C., closed cells as shown in FIG. 1 are formed. The reason why the pores are formed in the first glass layer is considered due to the fact that the resin binder contained in the glass paste for the first layer is burnt during the heating and fusion of the glass component, generating gases to form pores or voids therein. The porosity depends largely on the content of the resin binder and the heating temperature. In general, the content of the resin binder is in the range of from 1 to 10 wt % of the solid matters in the glass paste. The heating temperature ranges from 600 to 750 and the heating time ranges from 1 to 30 minutes for both layers. The glass useful for forming the first layer may be one which has a softening point ranging from 350° to 800° C. Examples of such glass include $PbO-B_2O_3$, $ZnO-B_2O_3-SiO_2$ glasses. The glass has typically a composition of PbO, $B_2O_3$ and $SiO_2$ in ratios by weight of 5:2:3. The resin binders may be any thermoplastic resins such as cellulose derivatives such as nitro cellulose, ethyl cellulose, methyl cellulose, carloxy methyl cellulose, hydroxy propl cellulose and mixtures.

The second layer may be made of any glass compositions except that such compositions should preferably have a softening point by about 100° C. lower than the glass composition for the first layer. Typical of the glass composition for the second layer is a mixture of PbO, $B_2O_3$ and $SiO_2$ in mixing ratios by weight of 7:1:2.

The substrate obtained according to the above-described method of the invention is very smooth on the surface of the second glass layer even though the metal plate used has a relatively large roughness of, for example, 1 μm. In general, when a solid material is bent, a maximal stress is produced on the surface of the material. If a metal plate bearing a glass layer thereon is bent, the brittle glass layer is broken or cracked. With the substrate obtained according to the invention, the breakage can be prevented to an extent by the action of the voids or pores present in the first glass layer provided between the metal plate and the second glass layer. The second glass layer has so large a hardness that it is more unlikely to suffer defects or deformation than resin layers.

The present invention is described in more detail by way of example.

A stainless steel plate (SUS 304) having a surface roughness of 1 μm, a thickness of 0.1 mm and a regular square form with each side of 10 cm was provided. Onto one side of the steel plate was applied, by a screen printing technique, a glass paste in a pattern where ten rectangles, each having a size of 36×16 mm, were arranged. This glass paste had a composition of a glass powder with a size below 3 μm and a binder in an amount of 10 wt % based on the glass powder. The glass powder had a composition of PbO, $B_2O_3$ and $SiO_2$ in mixing ratios by weight of 5:2:3 and the binder was made of nitro cellulose and butylcarbitol in a ratio by weight of 1:10.

The steel plate was placed in a dryer of 150° C. for 10 minutes to dry the paste, after which the plate was placed in a baking oven of 700° C. for 5 minutes in such a way that the glass-applied surface was kept upward and horizontal. As a result, the glass paste was fused and subsequently cooled to a normal temperature for hardening, thereby baking the glass on the steel plate to give a first glass layer.

Thereafter, a glass paste was again screen printed on the glass layer and then placed in a baking oven of 700° C. for 5 minutes to fuse the glass, followed by cooling down to a normal temperature for hardening to form a second glass layer on the first layer. The glass composition used in the glass paste for the second layer was a mixture of PbO, $B_2O_3$ and $SiO_2$ in ratios by weight of 7:1:2. This glass composition had a softening point lower by about 100° C. than the glass for the first layer.

The glass layers had, respectively a thickness of about 10 μm.

The steel plate was cut into sections bearing the glass layers thereon to obtain ten substrates.

Thirty substrates were made in the same manner as described above, of which three substrates were randomly sampled to check the state of the glass layers. As a result, it was found that a multitude of pores were formed in the first layer. A ratio by volume of the pore to the first glass layer which was obtained by calculation was about 250 ppm.

The 30 substrates were each subjected to measurement of a repeated bending test where it was bent 100 times at a minimum radius plus and minus 1 cm, revealing that no breakage such as cracks was found in the surface of the glass layer of the respective substrates. After completion of the bending test, a withstand voltage test was effected where 300 volts were applied across the glass layers of each substrate for 10 minutes, no dielectric failure was found.

For comparison, substrates which had no first layer having a multitude of pores therein were made and subjected to the repeated bending test under the same conditions as indicated above. As a consequence, it was found that cracks appeared in the glass surface when the substrates were bent only once. When the substrates were bent 5 to 10 times, about one third of the glass layer had fallen off from the substrate.

The 30 substrates obtained above were each formed on the glass layer side thereof with a 5000 angstrom thick stainless steel back electrode, an amorphous silicon layer composed of a p-type, an i-type and an n-type silicon layers having thicknesses of 300 angstrom, 5000 angstrom and 100 angstrom, respectively, and a transparent 700 angstrom electrode arranged in this order, thereby obtaining cell elements. Four elements were connected in series to obtain an amorphous silicon solar cell. This solar cell was found to have a release voltage between output terminals of 2.4 V and a short-circuit current of 12.6 μA under a fluorescent lamp of 150lx. The ten elements were subjected to the repeated bending test in the same manner as with the substrates over 10,000 bending cycles, revealing that no change was found with regard to the above characteristics.

When the above procedure of forming the glass layers was repeated using baking temperature ranging from 600° to 750° C., it was found that the ratio by volume of pores contained in the first glass layer was from 100 to 1000 ppm. The resulting substrates could endure the repeated bending test and withstand a voltage over 100 V in a subsequent breakdown voltage test.

What is claimed is:

1. A flexible, glass-covered substrate comprising a thin metal plate, a first glass layer formed on at least one side of said metal plate and having a multitude of pores therein, and a second glass layer formed on said first glass layer.

2. The flexible, glass-covered substrate according to claim 1, wherein said pores are closed cells.

3. The flexible, glass-covered substrate according to claim 1, wherein said pores are open cells.

4. The flexible, glass-covered substrate according to claim 1, wherein said metal plate has a thickness of from 10 to 300 μm, said first glass layer has a thickness of from 5 to 50 μm, and said second glass layer has a thickness of from 5 to 50 μm.

5. The flexible, glass-covered substrate according to claim 1, wherein said first glass layer has a ratio by volume of the pores to the total volume of said first layer is in the range of 100 to 1000 ppm.

6. The flexible, glass-covered substrate according to claim 1, wherein said first glass layer is made of a glass component having a softening point higher by about 100° C. than a glass component for said second glass layer.

7. The flexible, glass-covered substrate according to claim 6, wherein said glass component for said first glass layer is a mixture of PbO, $B_2O_3$ and $SiO_2$ in mixing ratios by weight of 5:2:3, and said glass component for said second glass layer is a mixture of PbO, $B_2O_3$ and $SiO_2$ in mixing ratios by weight of 7:1:2.

8. A method for making a flexible, glass-covered substrate, the method comprising the steps of:
   providing a thin metal plate;
   applying a glass paste comprising a glass component in the form of powder and a resin binder on at least one side of the metal plate;

heating the applied plate at temperatures sufficient to fuse the glass powder;

cooling the plate and hardening the fused glass to form a first glass layer;

applying a glass paste comprising a glass component having a softening point lower than the glass component of the first layer onto the first glass layer;

heating the applied paste at temperatures sufficient to fuse the glass component; and cooling and hardening the fused glass to form a second glass layer on the first glass layer whereby the first glass layer formed between the metal plate and the second glass layer becomes porous.

9. The method according to claim 8, wherein the glass paste for the first glass layer contains the resin binder in an amount of from 1 to 10 wt % based on the glass component.

10. The method according to claim 8, wherein the glass pastes for both layers are heated at temperatures of from 600 to 750 C.

* * * * *